(12) United States Patent
Sawada et al.

(10) Patent No.: US 10,120,519 B2
(45) Date of Patent: Nov. 6, 2018

(54) ELECTROSTATIC DETECTION SENSOR

(71) Applicant: Panasonic Intellectual Property Management Co., Ltd., Osaka (JP)

(72) Inventors: Takateru Sawada, Osaka (JP); Takuma Besshi, Osaka (JP); Erika Sawada, Aichi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 8 days.

(21) Appl. No.: 15/533,376

(22) PCT Filed: Jan. 12, 2016

(86) PCT No.: PCT/JP2016/000104
§ 371 (c)(1),
(2) Date: Jun. 6, 2017

(87) PCT Pub. No.: WO2016/132665
PCT Pub. Date: Aug. 25, 2016

(65) Prior Publication Data
US 2018/0239456 A1    Aug. 23, 2018

(30) Foreign Application Priority Data
Feb. 18, 2015   (JP) .................................. 2015-029140

(51) Int. Cl.
*G06F 3/044* (2006.01)
*G01D 5/24* (2006.01)
*H03K 17/96* (2006.01)

(52) U.S. Cl.
CPC ............ *G06F 3/044* (2013.01); *G01D 5/24* (2013.01); *H03K 17/962* (2013.01); *H03K 2017/9613* (2013.01)

(58) Field of Classification Search
CPC ..... G06F 3/044; H03K 17/955; H03K 17/962
See application file for complete search history.

(56) References Cited

U.S. PATENT DOCUMENTS 7,154,393 B2 * 12/2006 Okushima ............ H03K 17/962
340/562
7,319,301 B2 * 1/2008 Pribisic ................ H03K 17/955
200/61.43
(Continued)

FOREIGN PATENT DOCUMENTS

JP       2013-113626       6/2013

OTHER PUBLICATIONS

International Search Report of PCT application No. PCT/JP2016/000104 dated Apr. 19, 2016.

*Primary Examiner* — David M Gray
*Assistant Examiner* — Milton Gonzalez
(74) *Attorney, Agent, or Firm* — Greenblum & Bernstein, P.L.C.

(57) ABSTRACT

A sensor body of an electrostatic detection sensor includes a first electrode and a second electrode surrounding the first electrode. A controller is configured to obtain a first sensed intensity of the sensor body while where the first electrode is connected to the second electrode. The controller is configured to obtain a second sensed intensity of the first electrode while the second electrode is grounded. The controller is configured to obtain a third sensed intensity of the second electrode while the first electrode is grounded. The controller is configured to determine whether an object approaches the sensor body or not based on first to third calculation values obtained by calculating the respective changes of the first to third sensed intensities with respect to time.

16 Claims, 8 Drawing Sheets

(56) References Cited

U.S. PATENT DOCUMENTS

| | | | |
|---|---|---|---|
| 7,782,220 B2* | 8/2010 | Nakamura | H03K 17/955 324/658 |
| 8,692,565 B2* | 4/2014 | Togura | H03K 17/955 324/600 |

* cited by examiner

# ELECTROSTATIC DETECTION SENSOR

CROSS-REFERENCE TO RELATED APPLICATIONS

This application is a U.S. national stage application of the PCT international application No.PCT/JP2016/000104 filed on Jan. 12, 2016, which claims the benefit of foreign priority of Japanese patent application No. 2015-029140 filed on Feb. 18, 2015, the contents all of which are incorporated herein by reference.

TECHNICAL FIELD

The present invention relates to an electrostatic detection sensor mounted to, e.g. vehicles and various electronic devices.

BACKGROUND ART

Vehicles and various electronic devices have an electrostatic detection sensor mounted thereto. Depending on the result of detection by this electrostatic detection sensor, a predetermined operation can be effected.

PTL 1 discloses a conventional electrostatic detection sensor provided inside a housing of a door handle movably mounted on a vehicle body of a vehicle.

Figure 7:
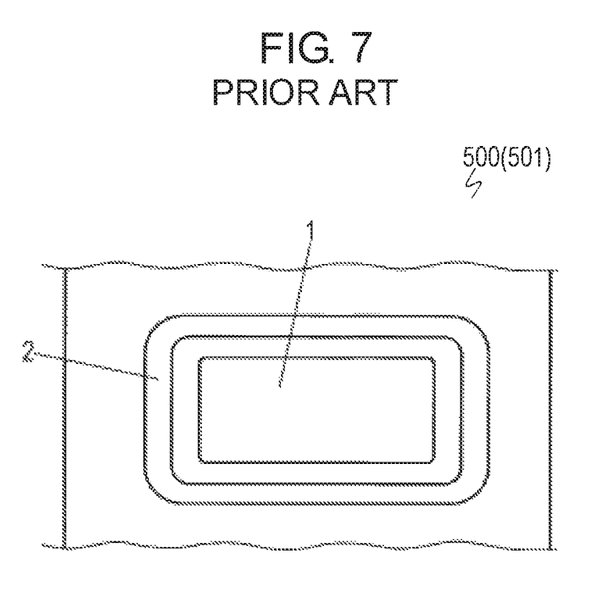
FIG. 7 is a plan view of a conventional electrostatic detection sensor.
Figure 8:
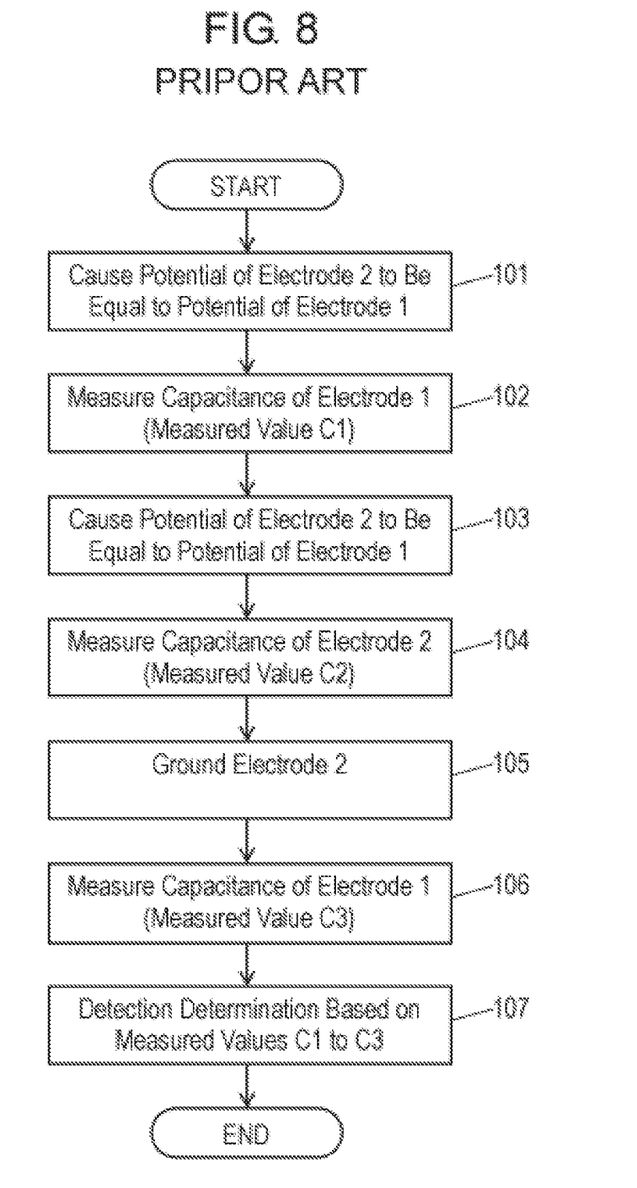
FIG. 8 is a flowchart of detection by the conventional electrostatic detection sensor.

FIG. 7 is a plan view of conventional electrostatic detection sensor 500 disclosed in PTL 1. FIG. 8 is a flowchart of detection by electrostatic detection sensor 500. As illustrated in FIG. 7, sensor body 501 of electrostatic detection sensor 500 includes first electrode 1 having a rectangular shape and second electrode 2 linearly surrounding first electrode 1 with a space between the electrodes. A user performs an operation by touching a portion corresponding to sensor body 501 with a finger. This operation causes a change in a capacitance formed between a conductor around the electrodes and each of first electrode 1 and second electrode 2. A controller sequentially performs processes 101 to 107 in accordance with the detection flow illustrated in FIG. 8 to detect an operation state based on the change of the capacitance.

CITATION LIST

Patent Literature

PTL 1: Japanese Patent Laid-Open Publication No. 2013-113626

SUMMARY

A sensor body of an electrostatic detection sensor includes a first electrode and a second electrode surrounding the first electrode. A controller is configured to obtain a first sensed intensity of the sensor body while where the first electrode is connected to the second electrode. The controller is configured to obtain a second sensed intensity of the first electrode while the second electrode is grounded. The controller is configured to obtain a third sensed intensity of the second electrode while the first electrode is grounded. The controller is configured to determine whether an object approaches the sensor body or not based on first to third calculation values obtained by calculating the respective changes of the first to third sensed intensities with respect to time.

This electrostatic detection sensor can detect an object, such as a finger, accurately even while being exposed to water.

DETAIL DESCRIPTION OF PREFERRED EMBODIMENT

Figure 1:
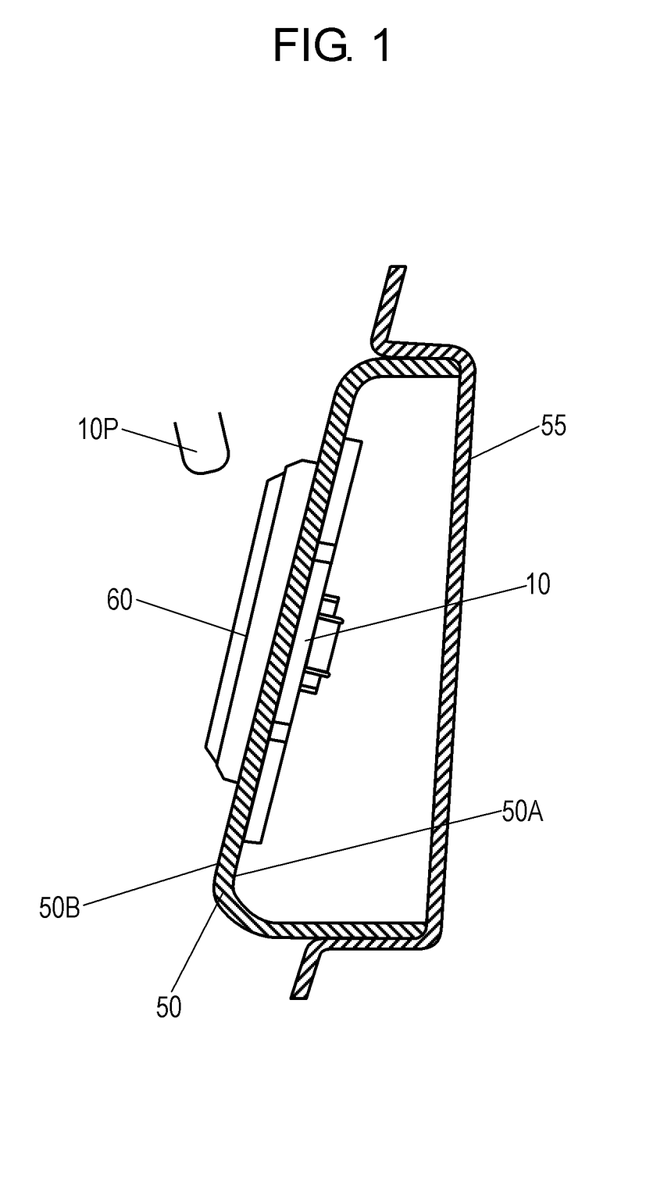
FIG. 1 is a cross-sectional view of a rear gate switch including an electrostatic detection sensor according to an exemplary embodiment.
Figure 2:
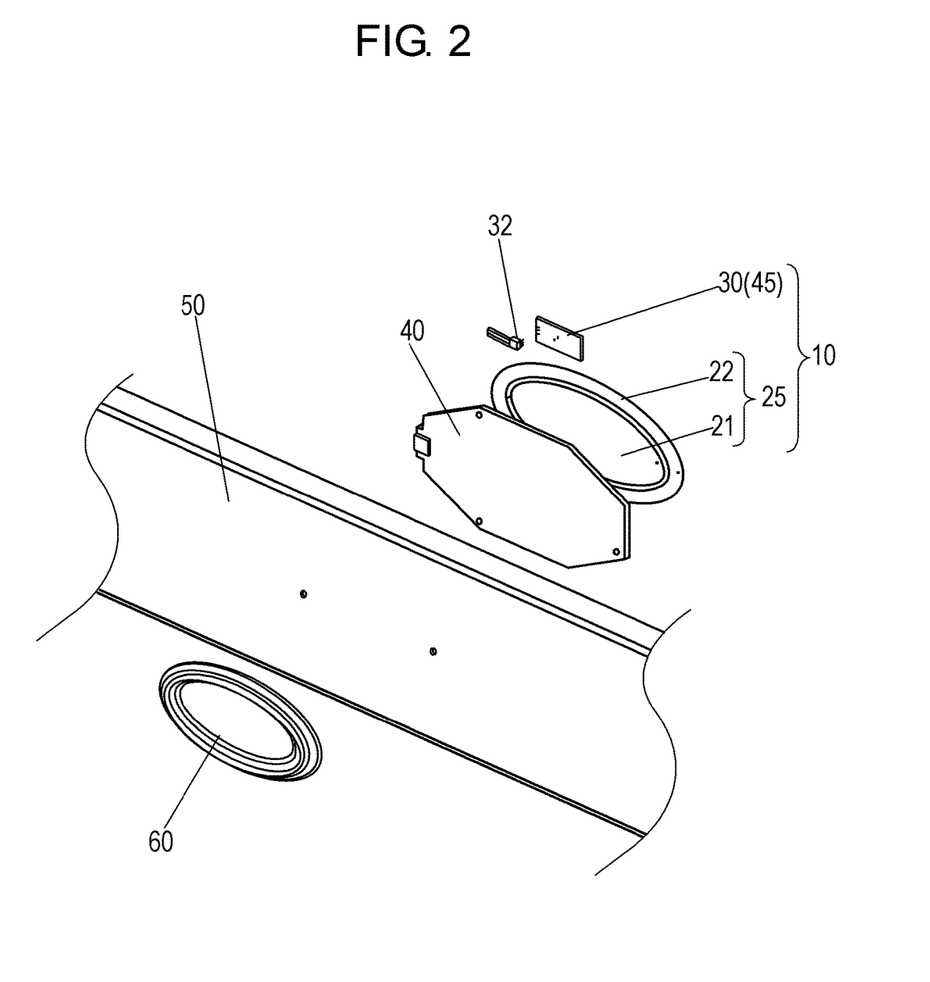
FIG. 2 is an exploded perspective view of the rear gate switch according to the embodiment.
Figure 3:
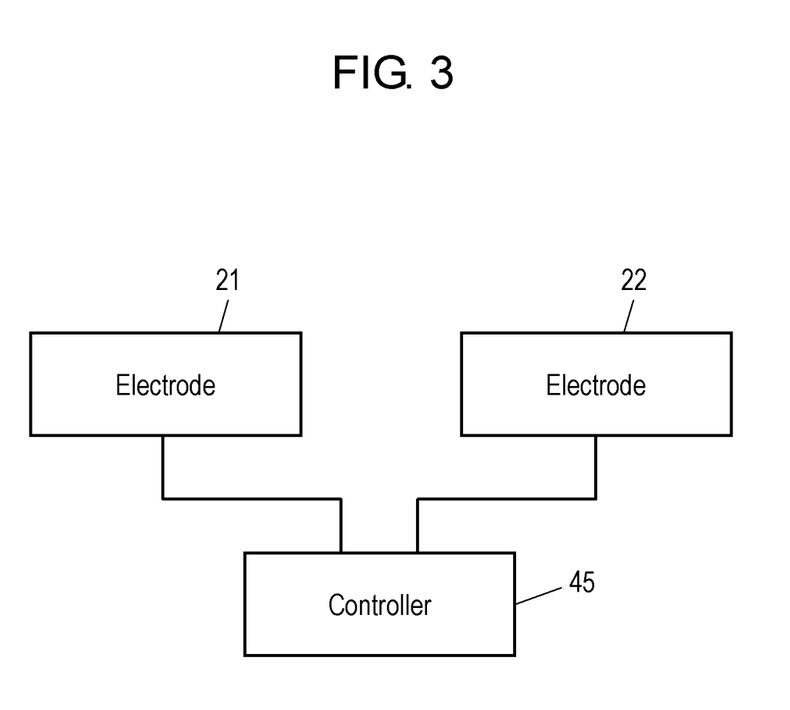
FIG. 3 is a block diagram of the electrostatic detection sensor according to the embodiment for illustrating a connection between the electrostatic detection sensor and a controller.

FIG. 1 is a cross-sectional view of a rear gate switch including electrostatic detection sensor 10 according to an exemplary embodiment. FIG. 2 is an exploded perspective view of the rear gate switch. FIG. 3 is a block diagram of electrostatic detection sensor 10.

Electrostatic detection sensor 10 is mounted onto inner surface 50A of rear garnish 50 provided in trunk door 55 at the rear of a vehicle body, and thus constitutes the rear gate switch. Rear garnish 50 is made of resin.

Electrostatic detection sensor 10 includes circuit board 30, sensor body 25, and controller 45 mounted onto circuit board 30. Sensor body 25 includes electrodes 21 and 22.

Electrodes 21 and 22 are made of metal plates. Electrode 21 has a circular shape. Electrode 22 has an annular shape. Electrode 21 may not necessarily have a circular shape.

Electrode 22 substantially surrounds the entire outer periphery of electrode 21 while being spaced from electrode 21. In other words, electrodes 21 and 22 are arranged as to be electrically independent from each other. Electrostatic detection sensor 10 is molded with resin 40 covering electrodes 21 and 22, and is mounted onto inner surface 50A of rear garnish 50 with, e.g. an adhesive.

Electrodes 21 and 22 are connected to controller 45 mounted onto circuit board 30. Controller 45 drives electrodes 21 and 22 to detect a change of a capacitance of electrode 21 and a change of a capacitance of electrode 22. Controller 45 is configured to perform predetermined processes for detecting the changes of the capacitances, and output signals corresponding to the processes. These signals are supplied to a device provided in the vehicle body via connector 32 mounted on circuit board 30.

Emblem 60 is mounted on outer surface 50B of rear garnish 50. Emblem 60 has a circular shape slightly smaller than a region in which electrodes 21 and 22 are arranged. Sensor body 25 faces emblem 60 as to cover emblem 60 via rear garnish 50.

Electrostatic detection sensor 10 is mounted to the vehicle body. Electrostatic detection sensor 10 is configured to detect whether object 10P, such as a finger, approaches emblem 60 or not.

An operation of electrostatic detection sensor 10 will be described below. When object 10P, such as a finger, approaches emblem 60, the capacitances of electrodes 21 and 22 change. Controller 45 detects the changes of the capacitances, and determines whether an input operation is performed or not.

Figure 4:
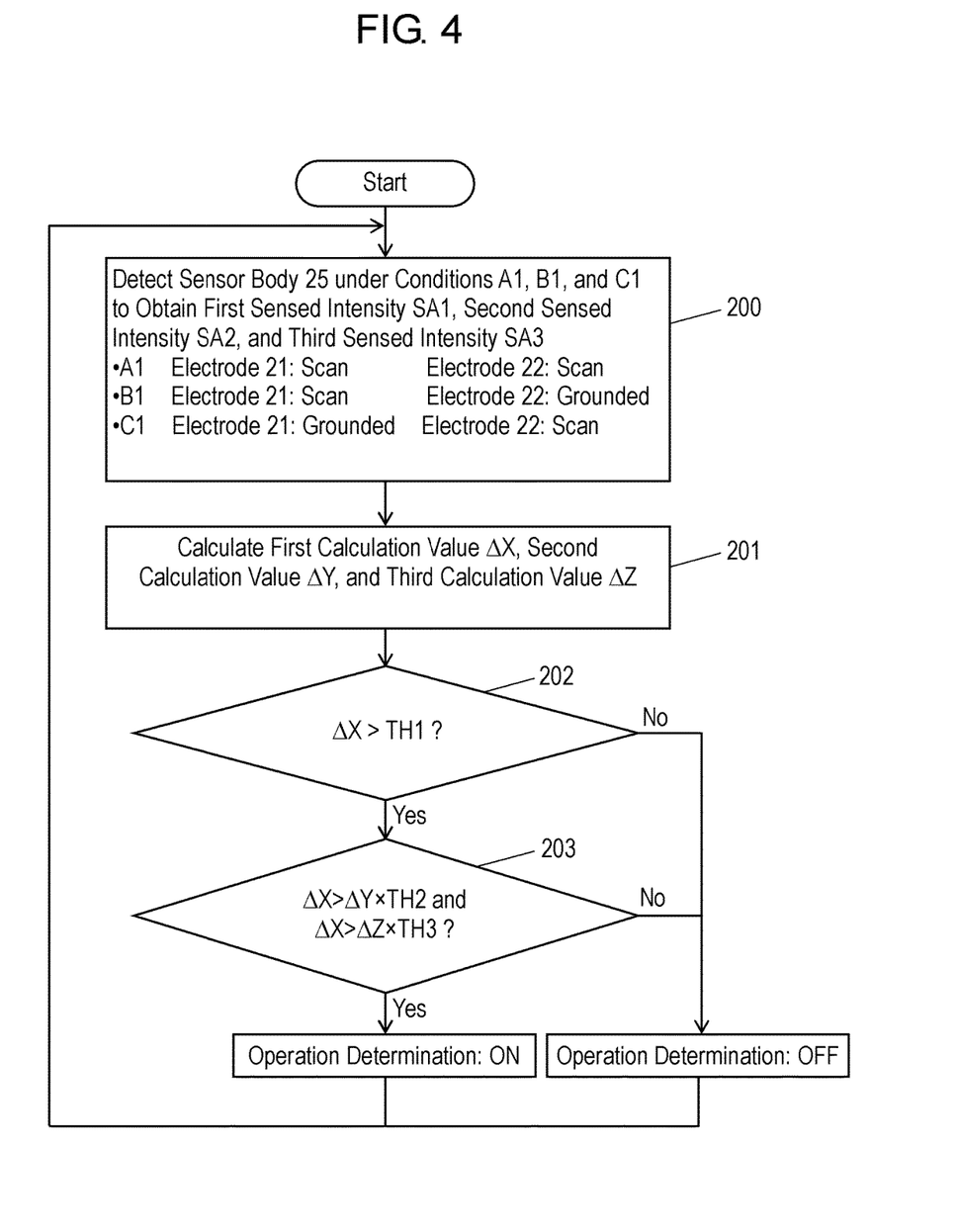
FIG. 4 is a flowchart of a detection operation of the electrostatic detection sensor according to the embodiment.

FIG. 4 is a flowchart of a detection operation of electrostatic detection sensor 10.

Upon having electrostatic detection sensor 10 be turned on, controller 45 detects a capacitance of sensor body 25 (process 200). In process 200, a change of the capacitance is detected under each of three conditions A1, B1, and C1.

Under condition A1, controller 45 applies a driving voltage to electrodes 21 and 22 while electrode 21 is electrically connected to electrode 22. At this moment, electrodes 21 and 22 are not connected to the ground (GND) to be grounded. Controller 45 scans sensor body 25, that is, electrodes 21 and 22 electrically connected to each other, as to obtain first sensed intensity SA1 corresponding to the capacitance of sensor body 25.

The scanning under condition A1 is a so-called coupled scanning performed to determine the presence of object 10P approaching sensor body 25. The coupled scanning allows sensor body 25 to have a maximum area, thereby largely expanding an electric field. Thus, sensed intensity SA1 reflects the change of the capacitance caused by, e.g. object 10P and water approaching from a position far away from the sensor body.

Under condition B1, controller 45 scans electrode 21 while electrode 22 is connected to a potential of the ground (GND) to be grounded as to obtain second sensed intensity SB1 corresponding to the capacitance of electrode 21. In other words, controller 45 applies a driving voltage to electrode 21 while electrode 21 is not connected to electrode 22, and connects electrode 22 to the potential of the ground (GND) to obtain second sensed intensity SB1.

Since electrode 22 is connected to the potential of the ground (GND), second sensed intensity SB1 positively reflects a change of the capacitance caused by water around electrode 21.

Under condition C1, controller 45 scans electrode 22 while electrode 21 is connected to the potential of the ground (GND) to be grounded as to obtain third sensed intensity SC1 corresponding to the capacitance of electrode 22. In other words, controller 45 applies a driving voltage to electrode 22 while electrode 21 is not connected to electrode 22, and connects electrode 21 to the electric of the ground (GND) as to obtain third sensed intensity SC1.

Since electrode 21 is connected to the potential of the ground (GND), third sensed intensity SC1 positively reflects a change of the capacitance caused by water around electrode 22.

In process 200, controller 45 switches conditions A1, B1, and C1 repetitively at predetermined time intervals of, e.g. 50 msec to obtain values of sensed intensities SA1, SB1, and SC1. Controller 45 repetitively performs process 200 even in a non-operation state in which electrostatic detection sensor 10 is not operated.

Subsequently, controller 45 performs process 201. In process 201, for example, value X0 of first sensed intensity SA1, value Y0 of second sensed intensity SB1, and value Z0 of third sensed intensity SC1 which are detected at time point t0, and value X1 of first sensed intensity SA1, value Y1 of second sensed intensity SB1, and value Z1 of third sensed intensity SC1 which are detected at time point t1 (=t0−500 msec) before time point t0 are used. Based on values X0 and X1 of first sensed intensity SA1, controller 45 calculates first calculation value $\Delta X$ (=X0−X1) which is a difference between values X0 and X1. Based on values Y0 and Y1 of second sensed intensity SB1, controller 45 calculates second calculation value $\Delta Y$ (=Y0−Y1) which is a difference between values Y0 and Y1. Based on values Z0 and Z1 of third sensed intensity SC1, controller 45 calculates third calculation value $\Delta Z$ (=Z0−Z1) which is a difference between values Z0 and Z1. The values of sensed intensities SA1, SB1, and SC1 under conditions A1, B1, and C1 are obtained by switching connection between electrodes 21 and 22, therefore not being obtained strictly simultaneously. However, the time required for switching between electrodes 21 and 22, that is, the time required for obtaining values of sensed intensities SA1, SB1, and SC1 is much shorter than a time interval (t0−t1) between time point t0 and time point t1, and therefore, controller 45 can substantially simultaneously obtain values of sensed intensities SA1, SB1, and SC1 at time point t0. Controller 45 can obtain values of sensed intensities SA1, SB1, and SC1 substantially simultaneously at time point t1.

Controller 45 preferably has a built-in calculation unit for performing the above-mentioned calculations. Contrary to the above-mentioned, first calculation value $\Delta X$ may be a difference ($\Delta X$=X1−X0) obtained by obtaining the difference between value X0 and value X1 in the reverse order to the above one. Similarly, contrary to the above-mentioned, second calculation value $\Delta Y$ may be a difference ($\Delta Y$=Y1−Y0) obtained by obtaining the difference between value Y0 and value Y1 in the reverse order to the above one. Contrary to the above-mentioned, third calculation value $\Delta Z$ may be a differential value ($\Delta Z$=Z1−Z0) obtained by obtaining the difference between value Z0 and value Z1 in the reverse order to the above one. The time interval between time point t0 and time point t1 is not necessarily 500 msec, but, is preferably equal to or shorter than 1000 msec.

Subsequently, in process 202, controller 45 compares first calculation value $\Delta X$ with predetermined first threshold TH1. When first calculation value $\Delta X$ is not larger than first threshold TH1 ("No" in process 202), controller 45 determines that emblem 60 (electrodes 21 and 22) is in a non-operation state of not being operated with object 10P (operation determination: OFF), and then returns to process 200.

When first calculation value $\Delta X$ is larger than first threshold TH1 in process 202 ("Yes" in process 202), controller 45 performs process 203.

In process 203, controller 45 multiplies second calculation value $\Delta Y$ by predetermined second threshold TH2 to obtain fourth calculation value ($\Delta Y \times TH2$), and compares first calculation value $\Delta X$ with fourth calculation value ($\Delta Y \times TH2$).

Then, in process 203, controller 45 multiplies third calculation value $\Delta Z$ by predetermined third threshold TH3 to obtain fifth calculation value ($\Delta Z \times TH3$), and compares first calculation value $\Delta X$ with fifth calculation value ($\Delta Z \times TH3$).

In process 203, when first calculation value $\Delta X$ is larger than fourth calculation value ($\Delta Y \times TH2$) and larger than fifth calculation value ($\Delta Z \times TH3$) ("Yes" in process 203), controller 45 determines that an operation is ON, that is, in this case, controller 45 determines that emblem 60 (electrodes 21 and 22) is in operation with object 10P, and controller 45 transmits a predetermined signal. Upon receiving the predetermined signal, a vehicle body performs a control corresponding to the signal, for example, unlocks trunk door 55.

In the detection operation, an operation determination is made using the comparison results of both the comparison between first calculation value ΔX and fourth calculation value (ΔY×TH2) and the comparison between first calculation value ΔX and fifth calculation value (ΔZ×TH3). The configuration covers the change of the capacitance of the entire of sensor body 25 in the operation determination to increase the accuracy of the operation determination. First calculation value ΔX is obtained by measuring the change of the capacitance of the entire of sensor body 25 by the coupled scanning of electrodes 21 and 22. Second calculation value ΔY is obtained by measuring the change of the capacitance only around electrode 21 while third calculation value ΔZ is obtained by measuring the change of the capacitance only around electrode 22. Thus, controller 45 confirms the change of the capacitance around electrode 21 based on the comparison between first calculation value ΔX and fourth calculation value (ΔY×TH2), and confirms the change of the capacitance around electrode 22 based on the comparison between first calculation value ΔX and fifth calculation value (ΔZ×TH3). Then, both the comparison results for operation determination allow an operation determination to be accurately made for the entire of sensor body 25.

In process 203, when first calculation value ΔX is not larger than fourth calculation value (ΔY×TH2) or first calculation value ΔX is not larger than fifth calculation value (ΔZ×TH3) (that is, "No" in process 203), controller 45 determines that emblem 60 (electrodes 21 and 22) is in a non-operation state of not being operated with object 10P (operation determination: OFF), and then returns to process 200.

In accordance with the above-mentioned flow, controller 45 performs an operation determination for an input operation. The reason for adopting this flow will be described below.

The changes of the capacitances detected by controller 45 include a change of the capacitance depending on environment. The change of the capacitance depending on environment is caused by, for example, the state of a film of a waterdrop or water remaining on a surface of electrostatic detection sensor 10 (in other words, on the surface of emblem 60), or an ambient temperature.

The changes of the capacitances detected by controller 45 further include a change of a capacitance depending on water for a short time. The change of the capacitance depending on the water is caused by, for example, the elimination of a path to the ground (GND) or a short-circuit path due to water flowing on a surface of electrostatic detection sensor 10.

In the detection operation, in order to accurately detect a change occurring at a current time point, the change of the capacitance from the previous state is measured. That is, a comparison between a capacitance detection result at the last time and a capacitance detection result at the current time point is performed to perform the operation determination. In other words, an operation determination is performed using first calculation value ΔX, second calculation value ΔY, and third calculation value ΔZ. Thus, a change of a capacitance depending on environment and a change of a capacitance depending on water for a short time are eliminated, hence providing the result of an operation determination accurately.

The reason why first calculation value ΔX, second calculation value ΔY, and third calculation value ΔZ provides the result of an operation determination accurately in electrostatic detection sensor 10 in accordance with the embodiment will be described below.

Figure 5:
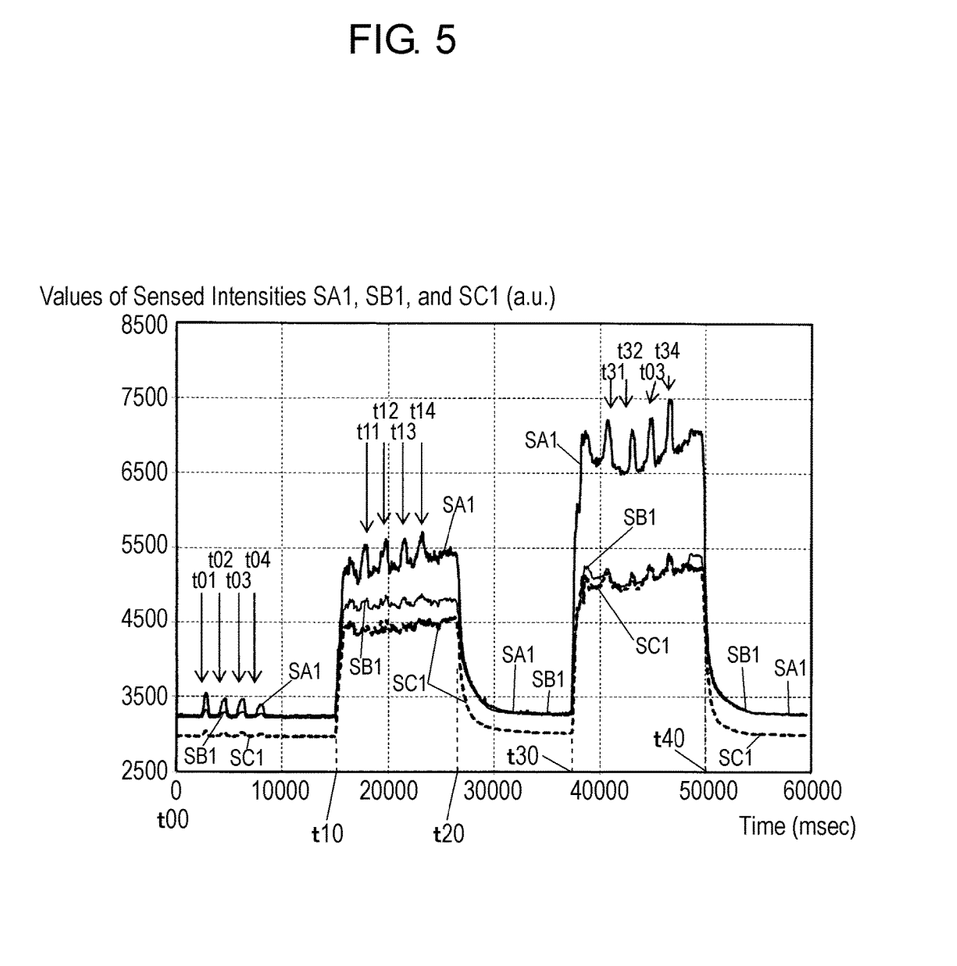
FIG. 5 illustrates changes of a capacitance of the electrostatic detection sensor according to the embodiment when a user holds a hand over an emblem.

FIG. 5 illustrates sensed intensities SA1, SB1, and SC1 corresponding to the capacitances detected under the conditions A1, B1, and C1 when a user holds a hand, object 10P, over emblem 60. In FIG. 5, the horizontal axis represents time, and the vertical axis represents values of sensed intensities SA1, SB1, and SC1. In FIG. 5, values of sensed intensities SA1, SB1, and SC1 are expressed in arbitrary units (a.u.) proportional to the capacitances. As described above, sensed intensities SA1, SB1, and SC1 correspond to the capacitances of electrodes 21 and 22 under conditions A1, B1, and C1, respectively. The left part of FIG. 5 illustrates measurement results of values of sensed intensities SA1, SB1, and SC1 obtained when a hand as object 10P is held over emblem 60 four times while emblem 60 is dry (emblem 60 is not wetted with water). Emblem 60 is not wetted with water and to be dry from time point t00 (=0) to time point t10. In the period from time point t00 to time point t10, object 10P (a hand or a finger) is held over emblem 60 (electrodes 21 and 22) to approach emblem 60 just 4 times in total at time points t01 to t04. The center of FIG. 5 illustrates the measurement results of values of sensed intensities SA1, SB1, and SC1 obtained when emblem 60 is sprinkled with water (shower water spraying) and a hand as object 10P is held 4 times over emblem 60 while water flows on a surface of emblem 60. Emblem 60 is sprinkled with water from time point t10 to time point t30. Emblem 60 is splashed actually with water particularly from time point t10 to time point t20 before time point t30. Then, water flows across emblem 60 and leaves emblem 60 in the period from time point t20 to time point t30. Object 10P (a hand or a finger) is held over emblem 60 (electrodes 21 and 22) to approach the emblem just four times in total at time points t11 to t14 in the period from time point t10 to time point t20. The right of FIG. 5 illustrates the measurement results of values of sensed intensities SA1, SB1, and SC1 obtained when water is poured on emblem 60 (spraying with hose-directed water) and a hand as object 10P is held over emblem 60 four times while water flows on the surface of emblem 60. Emblem 60 is sprayed with water directly from a hose to be wetted with the water from time point t30 to time point t40. The water spraying is stopped at time point t40. The sprayed water leaves emblem 60 after time point t40. Object 10P (a hand or a finger) is held over emblem 60 (electrodes 21 and 22) to approach the emblem just 4 times in total at time points t31 to t34 in the period from time point t30 to time point t40.

As shown in FIG. 5, when a user holds object 10P over emblem 60 to cause object 10P approach electrodes 21 and 22, measured capacitance values, namely, sensed intensities SA1, SB1, and SC1 increase temporarily at time points when object 10P approaches electrodes 21 and 22 (at time points t01 to 04, t11 to t14, and t31 to t34). The same change occurs in the period of the dry state (the period from time point t00 to time point t10), the period of the water sprinkling (the period from time point t10 to time point t20), and the period of the water pouring (the period from time point t30 to time point t40). However, the amount of the change of the measured capacitance values, namely, the changes of the values of sensed intensity SA1 during the coupled scanning of condition A1 is larger than the amount of change of values of sensed intensities SB1 and SC2 under conditions B1 and C1.

The detection operation employs the amount of changes of values of first sensed intensity SA1 obtained under condition A1, in other words, the amount of the change of capacitance values (first calculation value ΔX) with respect to time up to the current time point. This operation eliminates most of an influence of the change of the capacitance caused by environment, such as water that wets emblem 60. The approaching of object 10P, such as a finger, can be determined accurately over the entire of sensor body 25.

In the detection operation, after the approach of object 10P is determined in process 202, a determination using second calculation value ΔY and third calculation value ΔZ is made in process 203.

In process 203, fourth calculation value (ΔY×TH2) obtained from second calculation value ΔY is compared with first calculation value ΔX. Furthermore, fifth calculation value (ΔZ×TH3) obtained from third calculation value ΔZ is compared with first calculation value ΔX. For example, in the operations shown in FIG. 5, threshold TH2 is 2.5 while threshold TH3 is 3.0.

Door handles of vehicles are exposed to rainwater or water of car washing. Such water may flow on, e.g. a handle case, or enter into a door handle, then flowing on the sensor body. In this case, in the detection operation illustrated in FIG. 8 of the conventional electrostatic detection sensor, even when a portion corresponding to a sensor body is operated with a finger, the finger cannot be detected.

In electrostatic detection sensor 10 according to the embodiment, process 203 is performed for almost eliminating the influence of a change of a capacitance depending on water for a short time. In other words, the detection operation employs the amounts of the changes of the values of sensed intensities SA1, SB1, and SC1 obtained under conditions A1, B1, and C1, in other words, differences (calculation values ΔX, ΔY, and ΔZ) between capacitance values with respect to time lapsing to the current time point, hence eliminating most of the influence of a change of a capacitance depending on water for a short time. In other words, similarly to time points t01 to t04, t11 to t14, and t31 to t34 at which sensor body 25 is operated, calculation value ΔX is larger than threshold TH1 in process 202 at time points t10 and t30 at which emblem 60 is wetted with water. However, at time points t01 to t04, t11 to t14, and t31 to t34, calculation values ΔY and ΔZ based on values Y and Z of sensed intensities SB1 and SC1 are not so large, compared with calculation value ΔX. However, at time points t10 and t30, calculation values ΔY and ΔZ are as large as calculation value ΔX. Therefore, at least one of a calculation value (ΔY×TH2) and a calculation value (ΔZ×TH3) is larger than calculation value ΔX in process 203. Accordingly, process 203 results in "No", and consequently, controller 45 determines that an operation is OFF, that is, sensor body 25 is not operated. By contrast, at time points t01 to t04, t11 to t14, and t31 to t34, calculation values ΔY and ΔZ based on values Y and Z of sensed intensities SB1 and SC1 are not so large compared with calculation value ΔX. Therefore, a calculation value (ΔY×TH2) and a calculation value (ΔZ×TH3) are both smaller than calculation value ΔX in process 203. Accordingly, process 203 results in "Yes", and therefore controller 45 determines that an operation is ON, that is, sensor body 25 is operated, and controller 45 outputs a predetermined signal.

In view of a processing speed of controller 45, multiplication as process 203 of the above-mentioned detection operation is preferable for obtaining fourth calculation value (ΔY×TH2) and fifth calculation value (ΔZ×TH3). Instead of process 203, the fourth calculation value and the fifth calculation value may be obtained by division.

Figure 6:
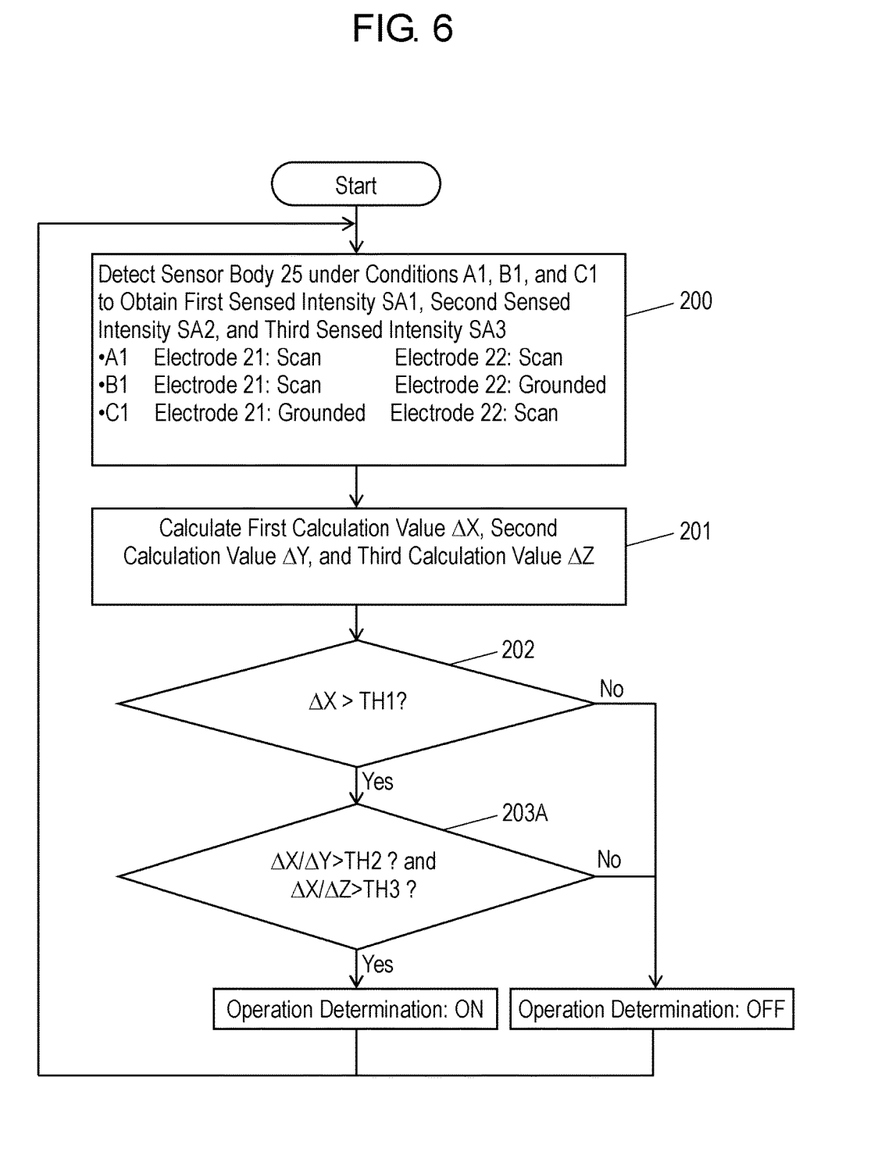
FIG. 6 is a flowchart of another detection operation of the electrostatic detection sensor according to the embodiment.

FIG. 6 illustrates another detection operation of electrostatic detection sensor 10 according to the embodiment. In FIG. 6, items identical to those in FIG. 5 are denoted by the same reference numerals. In the detection operation illustrated in FIG. 6, controller 45 performs process 203A instead of process 203 in the detection operation illustrated in FIG. 5. In process 203A illustrated in FIG. 6, controller 45 divides first calculation value ΔX by second calculation value ΔY to obtain fourth calculation value (ΔX/ΔY), and divides first calculation value ΔX by third calculation value ΔZ to obtain fifth calculation value (ΔX/ΔZ). Then, controller 45 compares fourth calculation value (ΔX/ΔY) with second threshold TH2, and compares fifth calculation value (ΔX/ΔZ) with third threshold TH3.

That is, when fourth calculation value (ΔX/ΔY) is larger than second threshold TH2 and fifth calculation value (ΔX/ΔZ) is larger than third threshold TH3 in process 203A ("Yes" in process 203A), controller 45 determines that an operation state (operation determination: ON) where emblem 60 is operated with object 10P has arisen, and outputs a predetermined signal to perform process 200. When fourth calculation value (ΔX/ΔY) is not larger than second threshold TH2 or fifth calculation value (ΔX/ΔZ) is not larger than third threshold TH3 ("No" in process 203A), controller 45 determines that a non-operation state (operation determination: OFF) where emblem 60 is not operated with object 10P has arisen, and then performs process 200.

In process 203A in the detection flow illustrated in FIG. 6, instead of fourth calculation value (ΔX/ΔY), the reciprocal of fourth calculation value (ΔX/ΔY) may be compared with threshold TH2, and instead of fifth calculation value (ΔX/ΔY), the reciprocal of fifth calculation value (ΔX/ΔY) may be compared with threshold TH3. In the comparison of the reciprocals, the direction of the inequality signs of the inequalities in process 203A is reversed. Controller 45 may divide second calculation value ΔY by first calculation value ΔX to obtain fourth calculation value (ΔY/ΔX), and may divide third calculation value ΔZ by first calculation value ΔX to obtain fifth calculation value (ΔZ/ΔX). Then, controller 45 compares fourth calculation value (ΔY/ΔX) with second threshold TH4, that is, the reciprocal of threshold TH2, and compares fifth calculation value (ΔZ/ΔX) with third threshold TH5, that is, the reciprocal of threshold TH3.

That is, in process 203A, when fourth calculation value (ΔY/ΔX) is smaller than second threshold TH4 and fifth calculation value (ΔZ/ΔX) is smaller than third threshold TH5, controller 45 determines that an operation state (operation determination: ON) where emblem 60 is operated with object 10P has arisen, and outputs a predetermined signal to perform process 200. When fourth calculation value (ΔY/ΔX) is not smaller than second threshold TH4 or fifth calculation value (ΔZ/ΔX) is not smaller than third threshold TH5, controller 45 determines that a non-operation state (operation determination: OFF) where emblem 60 is not operated with object 10P has arisen, and then performs process 200.

Alternatively, a reciprocal may be mixedly used. In other words, in process 203A, when fourth calculation value (ΔY/ΔX) is smaller than second threshold TH4 and fifth calculation value (ΔX/ΔZ) is larger than third threshold TH3, controller 45 determines that an operation state (operation determination: ON) where emblem 60 is operated with object 10P has arisen, and outputs a predetermined signal to perform process 200. When fourth calculation value (ΔY/ΔX) is not smaller than second threshold TH4 or fifth calculation value (ΔX/ΔZ) is not larger than third threshold TH3, controller 45 determines that a non-operation state (operation determination: OFF) where emblem 60 is not operated with object 10P has arisen, and then performs process 200.

Alternatively, in process 203A, when fourth calculation value (ΔX/ΔY) is larger than second threshold TH2 and fifth calculation value (ΔZ/ΔX) is smaller than third threshold TH5, controller 45 determines that an operation state (operation determination: ON) where emblem 60 is operated with object 10P has arisen, and outputs a predetermined signal to perform process 200. When fourth calculation value (ΔX/ΔY) is not larger than second threshold TH2 or fifth calculation value (ΔZ/ΔX) is not smaller than third threshold TH5, controller 45 determines that a non-operation state (operation determination: OFF) where emblem 60 is not operated with object 10P has arisen, and then performs process 200.

In the above, process 203 in which the fourth calculation value and the fifth calculation value are obtained by multiplication, or process 203A in which the fourth calculation value and the fifth calculation value are obtained by division are described. In the detection operation, the fourth calculation value and the fifth calculation value may be obtained by subtraction instead of multiplication or division while, instead of the second threshold or the third threshold, predetermined thresholds corresponding to the second and third thresholds are used. In other words, in process 203, controller 45 determines whether or not a calculation value (ΔX−ΔY) obtained by taking the difference between calculation values ΔX and ΔY is larger than predetermined second threshold TH6, and whether or not a calculation value (ΔX−ΔZ) obtained by taking the difference between calculation values ΔX and ΔZ is larger than predetermined third threshold TH7. When the calculation value (ΔX−ΔY) is larger than second threshold TH6 and the calculation value (ΔX−ΔZ) is larger than third threshold TH7, process 203 results in "Yes", and hence, controller 45 determines that an operation is ON, that is, sensor body 25 is operated, and controller 45 outputs a predetermined signal. When the calculation value (ΔX−ΔY) is not larger than second threshold TH6 or the calculation value (ΔX−ΔZ) is not larger than third threshold TH7, process 203 results in "No", and therefore, controller 45 determines that an operation is OFF, that is, sensor body 25 is not operated. In the case where the order of subtraction is reversed, the signs of thresholds TH5 and TH6 and the relationships between the absolute values of the calculation values and the absolute values of the thresholds are opposite to the above-described signs and relationships.

As described above, the detection operation eliminate most of the influence of a change of a capacitance caused by environment and the influence of a change of a capacitance depending on water for a short time, thereby detecting object 10P, such as a finger, that operates emblem 60 accurately. Object 10P may be a human body, such as a hand and an elbow, besides a finger. Besides the above, object 10P may be a member causes a change of the capacitance of sensor body 25 approaching emblem 60.

The shape of sensor body 25 of electrostatic detection sensor 10 may be appropriately determined. Electrode 22 has a shape substantially surrounding at least electrode 21.

In accordance with the embodiment, as an example, emblem 60 is mounted on outer surface 50B of rear garnish 50, but, emblem 60 is not essential. In other words, electrostatic detection sensor 10 may not necessarily include emblem 60.

Electrostatic detection sensor 10 may be applied to devices other than the rear gate switch. For example, electrostatic detection sensor 10 may be mounted into a door handle of a vehicle, or may be mounted to various electronic devices other than vehicles. In particular, electrostatic detection sensor 10 can detect object 10P accurately under various situations, such as a satiation where electrostatic detection sensor 10 is wetted with water. Hence, electrostatic detection sensor 10 is particularly useful when applied to a portion that could be wetted with water. For example, electrostatic detection sensor 10 may be mounted to household electrical appliances, such as washing machines, various electronic devices, such as portable information communication devices, portable information terminal devices, and cameras; or housing-related components, such as a doorknob of an entrance door. Alternatively, electrostatic detection sensor 10 may be mounted to various electronic devices that are unlikely to be wetted with an electrically conductive fluid, such as water.

INDUSTRIAL APPLICABILITY

An electrostatic detection sensor according to the present invention can detect an object accurately, and hence, is useful as a sensor constituting an operation section of, e.g. vehicles and various electronic devices.

REFERENCE MARKS IN THE DRAWINGS 10 electrostatic detection sensor
10P object
21 electrode (first electrode)
22 electrode (second electrode)
25 sensor body
30 circuit board
32 connector
45 controller
50A inner surface
50B outer surface
60 emblem
TH1 threshold (first threshold)
TH2 threshold (second threshold)
TH3 threshold (third threshold)
TH4 threshold (second threshold)
TH5 threshold (third threshold)

The invention claimed is:
1. An electrostatic detection sensor comprising:
a sensor body including
a first electrode, and
a second electrode surrounding the first electrode while being spaced from the first electrode; and
a controller connected to the first electrode and the second electrode,
wherein the controller is configured to:
obtain a first sensed intensity corresponding to a capacitance of the sensor body while the first electrode is connected to the second electrode;
obtain a second sensed intensity corresponding to a capacitance of the first electrode by applying a first driving voltage to the first electrode while the second electrode is grounded to a ground potential;
obtain a third sensed intensity corresponding to a capacitance of the second electrode by applying a second driving voltage to the second electrode while the first electrode is grounded to the ground potential; and
determine whether an object approaches the sensor body or not based on a first calculation value corresponding to a change of the first sensed intensity with respect to time, a second calculation value corresponding to a change of the second sensed intensity with respect to time, and a third calculation value corresponding to a change of the third sensed intensity with respect to time.

2. The electrostatic detection sensor according to claim 1, wherein the first calculation value is a difference between a value of the first sensed intensity at a first time point and a value of the first sensed intensity at a second time point.

3. The electrostatic detection sensor according to claim 1, wherein the second calculation value is a difference between a value of the second sensed intensity at a first time point and a value of the second sensed intensity at a second time point.

4. The electrostatic detection sensor according to claim 1, wherein the third calculation value is a difference between a value of the third sensed intensity at a first time point and a value of the third sensed intensity at a second time point.

5. The electrostatic detection sensor according to claim 1, wherein the controller is configured to determine whether the object approaches the sensor body by comparing the first calculation value with a predetermined first threshold.

6. The electrostatic detection sensor according to claim 5, wherein the controller is configured to:
obtain a fourth calculation value from the second calculation value and a predetermined second threshold;
obtain a fifth calculation value from the third calculation value and a predetermined third threshold; and
determine that the object approaches the sensor body when the first calculation value is larger than the fourth calculation value and larger than the fifth calculation value.

7. The electrostatic detection sensor according to claim 6, wherein the controller is configured to:
obtain the fourth calculation value by multiplying the second calculation value by the predetermined second threshold; and
obtain the fifth calculation value by multiplying the third calculation value by the predetermined third threshold.

8. The electrostatic detection sensor according to claim 5, wherein the controller is configured to:
obtain a fourth calculation value from the first calculation value and the second calculation value;
obtain a fifth calculation value from the first calculation value and the third calculation value; and
determine that the object approaches the sensor body when the fourth calculation value is larger than a predetermined second threshold and the fifth calculation value is larger than a predetermined third threshold.

9. The electrostatic detection sensor according to claim 8, wherein the controller is configured to:
obtain the fourth calculation value by dividing the first calculation value by the second calculation value; and
obtain the fifth calculation value by dividing the first calculation value by the third calculation value.

10. The electrostatic detection sensor according to claim 5, wherein the controller is configured to:
obtain a fourth calculation value from the first calculation value and the second calculation value;
obtain a fifth calculation value from the first calculation value and the third calculation value; and
determine that the object approaches the sensor body when the fourth calculation value is smaller than a predetermined second threshold and the fifth calculation value is smaller than a predetermined third threshold.

11. The electrostatic detection sensor according to claim 10, wherein the controller is configured to:
obtain the fourth calculation value by dividing the second calculation value by the first calculation value; and
obtain the fifth calculation value by dividing the third calculation value by the first calculation value.

12. The electrostatic detection sensor according to claim 5, wherein the controller is configured to:
obtain a fourth calculation value from the first calculation value and the second calculation value;
obtain a fifth calculation value from the first calculation value and the third calculation value; and
determine that the object approaches the sensor body when the fourth calculation value is smaller than a predetermined second threshold and the fifth calculation value is larger than a predetermined third threshold.

13. The electrostatic detection sensor according to claim 12, wherein the controller is configured to:
obtain the fourth calculation value by dividing the second calculation value by the first calculation value; and
obtain the fifth calculation value by dividing the first calculation value by the third calculation value.

14. The electrostatic detection sensor according to claim 5, wherein the controller is configured to:
obtain a fourth calculation value from the first calculation value and the second calculation value;
obtain a fifth calculation value from the first calculation value and the third calculation value; and
determine that the object approaches the sensor body when the fourth calculation value is larger than a predetermined second threshold and the fifth calculation value is smaller than a predetermined third threshold.

15. The electrostatic detection sensor according to claim 14, wherein the controller is configured to:
obtain the fourth calculation value by dividing the first calculation value by the second calculation value; and
obtain the fifth calculation value by dividing the third calculation value by the first calculation value.

16. The electrostatic detection sensor according to claim 1, wherein the object is a finger.

* * * * *